Jan. 23, 1962 R. L. CHASE 3,018,386

AMPLITUDE DISCRIMINATOR HAVING SEPARATE TRIGGERING AND RECOVERY CONTROLS UTILIZING AUTOMATIC TRIGGERING CONTROL DISABLING CLAMP

Filed Oct. 11, 1960

INVENTOR.
ROBERT L. CHASE
BY
Roland A. Anderson
Attorney 3,018,386

AMPLITUDE DISCRIMINATOR HAVING SEPARATE TRIGGERING AND RECOVERY CONTROLS UTILIZING AUTOMATIC TRIGGERING CONTROL DISABLING CLAMP

Robert L. Chase, Blue Point, N.Y., assignor to the United States of America as represented by the United States Atomic Energy Commission Filed Oct. 11, 1960, Ser. No. 62,062
8 Claims. (Cl. 307—88.5)

Figures 1, 2:
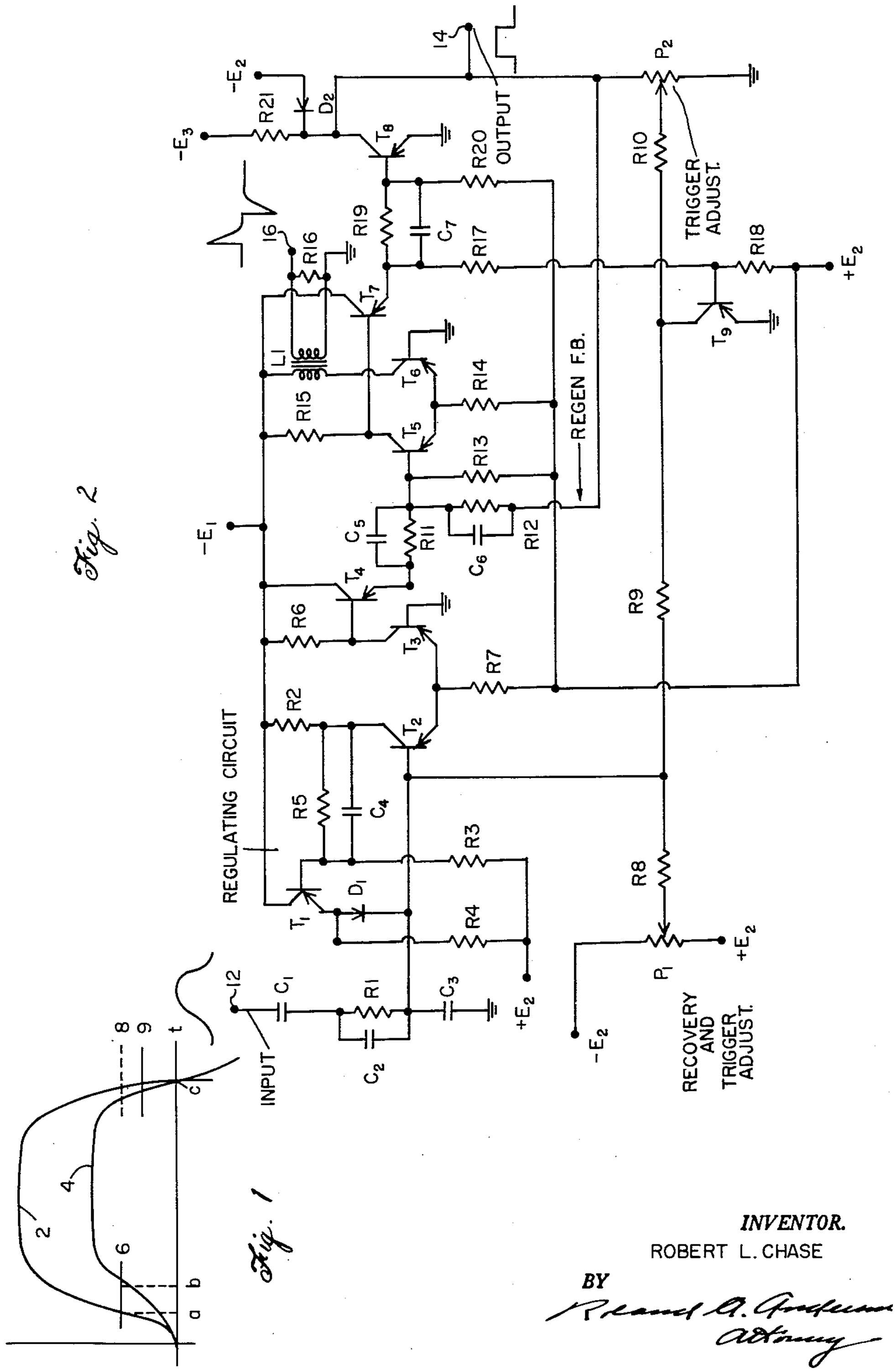

This invention relates to an amplitude discriminator circuit and more particularly to an amplitude discriminator circuit capable of adjusting independently the initial triggering and recovery voltage input levels.

In various pulse timing and coincidence applications, electronic amplitude discriminator circuits are employed for determining the initiation of an input signal pulse of predetermined minimum amplitude and to provide in response thereto a gating signal. Ideally, such amplitude discriminators should provide output gating signals whose timing is substantially independent of the height of the input signal pulse. This is difficult to achieve in the timing of the leading edge of the gating pulse, however, because amplitude discriminators generally operate upon the rising edge of the input signal pulse reaching a predetermined amplitude. It is in this rising portion of the input signal that timing is not independent of the amplitude of the input signal pulse. For example, a large amplitude input signal will reach the triggering threshold level in an appreciably shorter time than will a smaller amplitude signal. For input signals of different pulse amplitude, therefore, an amplitude discriminator of this type will introduce an error in the gating signal leading edge timing, the magnitude of which is an inverse function of the input signal pulse amplitudes.

An amplitude discriminator known as a Schmitt trigger circuit, or a cathode coupled binary, has found some use for this purpose. This discriminator is essentially a bistable system in which the initial triggering threshold level on the rising edge of the input pulse occurs at a greater value of the pulse amplitude than the level of the recovery triggering threshold on the falling edge of the input signal pulse. This difference between the amplitude level for initial triggering and that for recovery is known as the circuit hysteresis. With this amplitude discriminator the initial triggering threshold is set some value above the noise level and the circuit hysteresis is adjusted to the value which causes the trigger circuit to be reset by the falling edge of the input signal pulse as it crosses the base or zero line. Resetting of the Schmitt trigger circuit is necessary to establish the gating signal timing when input signals of different amplitude are introduced. Through use of this amplitude discriminator the timing error is substantially eliminated since the recovery threshold level is independent of the input signal pulse amplitude although the timing of the initial triggering still depends on the input signal pulse amplitude. Because of this improvement, the resolving time of the associated circuitry can be shortened without loss of information.

However, the usefulness of the Schmitt trigger circuit as described above is limited due to the fact that the initial triggering sensitivity of the circuit cannot be changed without effecting a change in the recovery threshold. To retain the recovery sensitivity of the circuit, an adjustment requiring precision auxialiary calibration equipment of the type normally found in a well-equipped electronics or instrumentation shop is necessary and this requires a high degree of training and technical competence for its proper use. Such precision test equipment cannot conveniently be provided in the field where the amplitude discriminator is to be used. Consequently, it becomes necessary either to operate at one preselected sensitivity level only, which is undesirable, or to arrange to have either the calibration and testing equipment or the amplitude discriminator transported back and forth from the use site to the electronics shop every time it is desired to change the sensitivity of the trigger circuit.

According to the present invention, this deficiency is overcome by providing a discriminator circuit capable of having both the sensitivity and the circuit hysteresis conveniently and easily adjusted as circumstances warrant. For this purpose, there is provided a biased amplitude discriminator circuit having two independent components of bias, with one bias component set at a value corresponding to the circuit hysteresis and the second bias component adjustable from zero to an arbitrary full scale value to vary the trigger threshold level, in combination with a switching circuit which positively removes the second bias component from the circuit upon activation of the trigger such that the recovery threshold is always at the point where the trailing edge of the input signal pulse goes through zero. Further, the circuit is transistorized for compactness and to minimize the effects of aging.

It is thus one object of this invention to provide a novel amplitude discriminator circuit of the type described for use in coincidence measurements which has reset at input signal zero crossover.

Another object of this invention is to provide a novel amplitude discriminator circuit for use in coincidence measurements in which the trigger sensitivity can be varied over a wide range without affecting the timing.

A further object of this invention is to provide an amplitude discriminator circuit in which the recovery threshold is always at the input signal pulse zero crossover independent of the initial trigger threshold level.

A still further object of this invention is to provide an amplitude discriminator circuit employing transistor switching to make the recovery threshold level independent of the initial trigger threshold level.

A complete and better understanding of this invention can be had by reference to the accompanying drawings in which:

FIGURE 1 represents the effect of pulse amplitude on the timing of two pulses having different amplitude duration; and FIGURE 2 is a schematic electronic wiring diagram of a preferred embodiment of this invention.

Referring now to FIGURE 1, there are shown two pulses, 2 and 4, having different amplitude but identical duration drawn with the amplitude as the ordinate and the time as the abscissa. The initial threshold level is indicated by the solid horizontal line 6 and its extrapolation to the broken line 8. A typical reset threshold level for a Schmitt circuit with hysteresis is indicated by horizontal line 9. The hysteresis is represented by the vertical separation between lines 8 and 9. The timing error which arises when the threshold response of the discriminator is not adjusted for signals of different amplitude is represented by the separation between *a* and *b*, the projections onto the abscissa of the intersection of line 6 with curves 2 and 4. Adjustment of line 6 will result in shifting of line 9 unless extensive adjustments as mentioned above are made.

The effect of using a discriminator circuit with reset fixed at *c* while making adjustments of line 6 to suit operating conditions would eliminate variations in gating pulse timing due solely to changes in pulse amplitude. By the arrangement of FIG. 2, the reset may be fixed at *c* while line 6 moved conveniently to meet changing pulse amplitude conditions to obtain this result.

Referring to FIGURE 2, for a description of a preferred embodiment of a discriminator circuit constructed according to the principles of this invention, there is shown a first transistor T1 for controlling the normal operation of a transistor T2 forming part of a first difference amplifier consisting of transistors T2 and T3. The input to the circuit of FIGURE 2 is on a contact 12 through a condenser C1, and a resistor R1 to the base of transistor T2. A small adjustable bypass condenser C2 is provided for resistor R1. The output of the circuit may be taken from contacts 16 or 14, to be discussed below. The base of transistor T2 is connected to ground through a capacitor C3 to adjust input capacitance to the circuit. The emitter of transistor T1 is connected through a diode D1 to the base of transistor T2 while the collector of transistor T1 is connected to the voltage power supply $(-)E_1$ as illustrated. The collector of transistor T2 is connected to power supply $(-)E_1$ through resistor R2. The base of transistor T1 receives bias through a resistor R3 connected to the power supply $(+)E_2$, while its emitter is connected to $(+)E_2$ through a resistor R4. The base of transistor T1 and the collector of transistor T2 are interconnected by a feedback resistor R5 and a capacitor C4 in parallel as is illustrated. Transistor T3 forming the other half of the first difference amplifier has its collector connected through a resistor R6 to source $(-)E_1$ while its emitter is connected in common with transistor T2 through a resistor R7 to the $(+)E_2$ power supply. Bias of transistor T2 is obtained through the use of a network consisting of a potentiometer P1 connected between $(+)E_2$ and $(-)E_2$ as illustrated and a wiper which is connected to the wiper of a potentiometer P2 through resistors R8, R9 and R10. The base of transistor T2 is connected to the common point between resistors R8 and R9. Potentiometer P2 is connected between ground and source $(-)E_3$ through a resistor R21, and through a diode D2 to source $(-)E_2$. Diode D2 limits the negative voltage on potentiometer P2 to the $(-)E_2$ source.

A transistor T4 is connected with its collector to the $(-)E_1$ source, its base to the collector of transistor T3, and its emitter to the base of transistor T5 through a resistor R11 having a bypass condenser C5, for the purpose of transferring the output of the first difference amplifier to the difference amplifier consisting of transistors T5 and T6. The base of transistor T3 is grounded. The base of transistor T5 is also connected to source $(+)E_2$ through a resistor R13, and to the output contact 14 through a resistor R12 having a bypass condenser C6. The latter connection is for regenerative feedback purposes, to be explained later. The second difference amplifier consisting of the transistors T5 and T6 have a common emitter connection through a resistor R14 and to the $(+)E_2$ power source. The base of transistor T6 is grounded as illustrated. The collector of transistor T5 is connected to the $(-)E_1$ power source through a resistor R15 while the collector of transistor T6 is connected through the primary coil of a transformer L1 to the same source $(-)E_1$. An output of the whole circuit in the form of positive and negative spikes is taken off the secondary of transformer L1 on a contact 16 with a load formed across a resistor R16. For taking the output of the second difference amplifier in the form of square gating pulses on contact 14, a transistor T7 is connected with its base to the collector of transistor T5, its collector to the $(-)E_1$ power source, and its emitter to resistors R17 and R18 to the $(+)E_2$ power source. The emitter of transistor T7 is also connected through a resistor R19 in parallel with a capacitor C7 to deliver its output to the base of a transistor T8. The base of transistor T8 is connected through a resistor R20 to the $(+)E_2$ power source, while the emitter thereof is grounded and its collector is connected to the $(-)E_3$ power source through resistor R21 and to a $(-)E_2$ power source through diode D2 oriented as illustrated. As clearly noted, one of the outputs of this circuit is taken directly on contact 14 which is directly connected to the collector of transistor T8, as well as one end of potentiometer P2. A transistor T9, performing a function to be described below, is placed with its collector connected to the common point between resistors R9 and R10, and its emitter grounded. The base connection is through resistor R18 to $(+)E_2$.

The operation of this circuit is as follows: potentiometers P1 and P2 with their respective wipers and resistors R8, R9 and R10 form a current bias network. With the absence of an input signal on contact 12 above a predetermined threshold level sufficient to trigger the circuit, the bias on the base of transistor T2 as determined by the positions of the wipers on potentiometers P1 and P2 adjusted in a manner to be described further below is such that transistor T2 is in conduction. Current is maintained constant by the action of the feedback resistor R5 and transistor T1 which regulate current flow through diode D1 and the base of transistor T2 to oppose changes in collector current. The current from source $(+)E_2$ flowing through resistor R4 divides at the emitter of transistor T1 with some of the current flowing through diode D1 and the remaining current flowing through transistor T1 to the negative voltage source $(-)E_1$. Due to the condition of transistor T2 drawing heavy current, the emitter of transistor T3 will draw little current. Therefore, the base of transistor T4 is rendered highly negative by source $(-)E_1$ so that this transistor is conducting. Transistor T5, as a result, is conducting in this initial state, due to bias on its base delivered by resistors R11 and R13 connected as illustrated, and also due to the effect of transistor T4 which maintains a low voltage on the base of transistor T5. Due to low emitter voltage, transistor T6 is non-conducting. Transistor T7 with its base connected to the collector of T5 is conducting due to biasing effect of source $(+)E_2$ through resistors R17 and R18, the source $(-)E_1$ on its collector, and the voltage level on the collector of transistor T5. Transistor T8 is not conducting due to the current flow from $(+)E_2$ through resistor R20 and the voltage drop across resistor R19, thereby having the base positive with respect to ground. Transistor T9 in this initial state of the circuit is non-conducting because of the voltage level on its base established by the current through resistor R18.

When a positive going pulse above the threshold value of the circuit appears on input contact 12, this will terminate conduction through transistor T2 due to the cancellation of the base bias. Transistor T3 will then conduct due to a rise in voltage on its emitter. When this occurs, the voltage level on the base of transistor T4 rises (less negative) thereby decreasing current therethrough and increasing the voltage level on the base of transistor T5 causing it to cease conducting and transistor T6 to conduct. The switching of current flow from transistor T5 to T6 immediately establishes a first pulse through transformer L1 which is taken as a spike across resistor R16 on output contact 16, thereby indicating the point at which the pulse input on contact 12 has reached the minimum level required to operate this circuit. With transistor T5 going into a non-conducting state, the voltage level on the base of transistor T7 immediately drops thereby increasing current flow through resistors R17 and R20 resulting in the transfer of transistor T8 into its conducting state with the voltage level on the collector of transistor T8 rising quickly to a new level to begin a pulse output on contact 14 due to the increased current flow through the resistor R21. Feedback from contact 14 through resistor R12 to the base of transistor T5 accelerates this switching action, causing a trigger type response.

When transistor T8 reaches saturation, the voltage across potentiometer P2 rises nearly to zero. The small bias component that remains because of the imperfect saturation of transistor T8 is removed by transistor T9 which saturates when transistor T7 draws increased current and fixes the wiper of potentiometer P2 substantially at ground. Thus, regardless of the setting of potentiometer P2, the net bias current after switching is determined almost entirely by the setting of potentiometer P1. Therefore, if potentiometer P1 is properly adjusted, the circuit recovers when the input signal passes through zero regardless of the setting of potentiometer P2. This feature of the circuit permits the separate setting of the initial threshold value from the recovery value as will be seen further below.

The states of the transistors shown in FIGURE 2 are summed up in the Table I below:

*Table I*

| Transistor | Before Triggering | After Triggering |
|---|---|---|
| T1 | on | on. |
| T2 | on | off. |
| T3 | on | on. |
| T4 | on | on. |
| T5 | on | off. |
| T6 | off | on. |
| T7 | on | on. |
| T8 | off | on. |
| T9 | off | on. |

In order to adjust the bias on the base of transistor T2 so that the recovery threshold will occur when the trailing edge of the input signal pulse reaches zero, a pulse generator (not shown) having a suitable wave form is connected to an oscilloscope and to input 12. Output 16 is also connected to the oscilloscope. Potentiometer P2 is adjusted so that its wiper is substantially grounded and potentiometer P1 is then varied until the amplitude discriminator recovery threshold and zero crossover of the input signal pulse are in coincidence as shown by the oscilloscope trace. After this initial setting of potentiometer P1, this component of the bias is not changed. Potentiometer P2 can be adjusted as desired to change the other component of the bias to alter the trigger initial threshold sensitivity, whenever such change is indicated with complete assurance that the recovery threshold will not be affected.

A circuit of the type described above which was constructed and operated successfully has the components listed in Table II, below:

*Table II*

| Part | Ohms | Capacitance | Component |
|---|---|---|---|
| R1, R3, R12 | 20K | | |
| R2, R5 | 2.7K | | |
| R4 | 1.8K | | |
| R6 | 3.6K | | |
| R7 | 10K | | |
| R8 | 51K | | |
| R9, R10, P2 | 1K | | |
| R11 | 1.5K | | |
| R13 | 6.8K | | |
| R14 | 2K | | |
| R15 | 820 | | |
| R16 | 1,000 | | |
| R17, R20 | 5.1K | | |
| R18 | 68K | | |
| R19 | 510 | | |
| R21 | 390 | | |
| P1 | 25K | | |
| C1 | | 1 $\mu f$ | |
| C2, C6 | | 12 $\mu\mu f$ | |
| C3 | | 100 $\mu\mu f$ | |
| C4 | | .001 $\mu f$ | |
| C5 | | 100 $\mu\mu f$ | |
| C7 | | 330 $\mu\mu f$ | |
| T1, T8 | | | 2N501. |
| T2, T3, T4, T5, T6, T7, T9 | | | 2N344. |

The power supplies for the foregoing circuit are shown in Table III below:

*Table III*

| Source: | Volts |
|---|---|
| $E_1$ | 4.5 |
| $E_2$ | 10 |
| $E_3$ | 20 |

It is thus seen there has been provided an amplitude discriminator of great flexibility for use in a variety of applications and conditions. While only a single embodiment of this invention has been described, it should be understood that within the scope of the appended claims, the invention may be practiced otherwise than as specifically described.

I claim:

1. An amplitude discriminator comprising in combination an active element having a control electrode, means for biasing said control electrode to maintain said element in an active state in the absence of a signal pulse on said electrode, the latter said means including first and second separate voltage selector means for together adjusting the bias on said electrode, input means to said discriminator for delivering signal pulses to said control electrode in opposite polarity to said bias whereby a pulse exceeding a firing threshold of said discriminator as established by said bias on said electrode will terminate conduction in said element, and means responsive to the termination of conduction in said element for clamping the voltage of said second selector means at some predetermined level thereby effectively making said first selector means solely selective in determining the recovery threshold of said discriminator and said second selector means solely selective in determining the firing threshold of said discriminator.

2. The amplitude discriminator of claim 1 in which said first and second selector means are each potentiometers across power sources and having their wipers interconnected through resistance means, said electrode being connected to some intermediate point in said resistance means for establishing the aforesaid bias.

3. An amplitude discriminator comprising in combination an active element having a control electrode and an output electrode, means for biasing said control electrode to maintain said element in an active state in the absence of a signal pulse on said electrode, the latter said means including first and second separate voltage selector means for together adjusting the bias on said electrode, feedback means extending from said output electrode to said control electrode for maintaining the current through said active element during conduction at a closely regulated constant value, input means to said discriminator for delivering signal pulses to said control electrode in opposite polarity to said bias whereby a pulse exceeding a firing threshold of said discriminator as established by said bias on said electrode will terminate conduction in said element, and means responsive to the termination of conduction in said element for clamping the voltage of said second selector means at some predetermined level thereby effectively making said first selector means solely selective in determining the recovery threshold of said discriminator and said second selector means solely selective in determining the firing threshold of said discriminator.

4. An amplitude discriminator comprising in combination a difference amplifier consisting of first and second transistors each having a control base electrode, means for biasing the control electrode of said first transistor to maintain said first transistor in an active state in the absence of a signal pulse on said first transistor electrode and said second transistor in an inactive state, the latter said means including first and second separate voltage selector means for together adjusting the bias on said first transistor electrode, input means to said discriminator for delivering signal pulses to said first transistor electrode in opposite polarity to said bias whereby a pulse exceeding a firing threshold of said discriminator as established by said bias on said electrode will terminate conduction in said transistor and cause said second transistor to be conductive, and means responsive to initiation of conduction in said second transistor for clamping the voltage of said second selector means at some predetermined level thereby effectively making said first selector means solely selective in determining the recovery threshold of said discriminator and said second selector means solely selective in determining the firing threshold of said discriminator.

5. The amplitude discriminator of claim 4 in which said first and second transistors are connected in parallel with the emitters thereof connected in common and the collector of said second transistor is connected to said clamping means.

6. An amplitude discriminator comprising in combination a difference amplifier consisting of first and second transistors each having a control base electrode and having a common emitter connection, means for biasing the control electrode of said first transistor to maintain the said first transistor in a heavily conductive state in the absence of a signal pulse on said first transistor electrode and said second transistor in a barely conductive state, said biasing means including first and second separate voltage selector means for together adjusting the bias on said first transistor electrode, input means to said discriminator for delivering signal pulses to said first transistor electrode in opposite polarity to said bias whereby a pulse exceeding a firing threshold of said discriminator as established by said bias on the latter said electrode will terminate conduction in said first transistor and cause said second transistor to become heavily conductive and draw all emitter current, and means responsive to initiation of current flow through said second transistor for clamping the voltage of said second selector means at some predetermined level thereby effectively making said first selector means solely selective in determining the recovery threshold of said discriminator and said second selector means solely selective in determining the firing threshold of said discriminator, the latter said means delivering the output of said discriminator and including regenerative feedback means for producing relatively fast response to both the triggering and recovering of said discriminator.

7. The amplitude discriminator of claim 6 in which said clamping means includes a pair of transistors connected in parallel with the emitters thereof connected in common and the base electrode of one receiving its input from the output of said difference amplifier, the output of said discriminator is taken from at least one of the collectors in said pair of transistors, and said regenerative feedback means is connected between the output of said pair of transistors to the aforementioned base electrode of said transistor pair.

8. An amplitude discriminator comprising in combination first and second difference amplifiers, said first amplifier consisting of first and second transistors having a common emitter connection and each having a control base electrode and a collector, said second amplifier consisting of third and fourth transistors having a common emitter connection and each having a control base electrode and a collector, means for biasing the control electrode of said first transistor to maintain said first transistor in a heavily conductive state in the absence of a signal pulse on said first transistor base electrode and said second transistor in a barely conductive state, means connected to the collector of said second transistor for maintaining said third transistor conductive and said fourth transistor non-conductive in response to the non-conductive state of said second transistor, said biasing means including first and second separate voltage selector means for together adjusting the bias on said first transistor bias electrode, input means to said discriminator for delivering signal pulses to said first transistor base electrode in opposite polarity to said bias whereby a pulse exceeding a firing threshold of said discriminator as established by said bias on said base electrode will terminate conduction in said first transistor and cause said second transistor to be heavily conductive, said third transistor becoming non-conductive and said fourth transistor conductive, in response to the conductive state of said second transistor, and means including a fifth transistor responsive to the termination of conduction in said third transistor for rendering said fifth transistor conducting to clamp the voltage of said second selector means at some predetermined level thereby effectively making said first selector means solely selective in determining the recovery threshold of said discriminator and said second selector means solely selective in determining the firing threshold of said discriminator.

No references cited.